United States Patent [19]

Kung et al.

[11] 4,202,045
[45] May 6, 1980

[54] WRITE CIRCUIT FOR A READ/WRITE MEMORY

[75] Inventors: Roger I. Kung; Jerry D. Moench, both of Austin, Tex.

[73] Assignee: Motorola, Inc., Schaumburg, Ill.

[21] Appl. No.: 17,747

[22] Filed: Mar. 5, 1979

[51] Int. Cl.² .............................................. G11C 13/00
[52] U.S. Cl. ................................... 365/203; 365/189; 307/238
[58] Field of Search ..................... 365/189, 203, 233; 307/238

[56] References Cited

U.S. PATENT DOCUMENTS

| 4,145,759 | 3/1979 | Remedi ............................ 365/203 |
| 4,160,291 | 7/1979 | Smith et al. ........................ 365/203 |

Primary Examiner—Terrell W. Fears
Attorney, Agent, or Firm—Joe E. Barbee

[57] ABSTRACT

There is provided a write circuit which is held in a disabled state until data is available to be written into the memory. This circuit is particularly useful for memories having one data in buffer and more than one memory block wherein each memory block has a write circuit to couple data in from the data in buffer. The write circuit has an input transfer device which is maintained in a disabled condition by an address signal until it is addressed. The output of the transfer device is maintained in a discharged state by the complement of the column address strobe. The output of the transfer device is coupled by a latch circuit to bit sense common lines in the memory.

8 Claims, 2 Drawing Figures

WRITE CIRCUIT FOR A READ/WRITE MEMORY

This invention relates, in general, to input circuits, and more particularly, to a write circuit for a read/write memory.

In the field of integrated semiconductor memories much progress has been made towards providing large memories on a single semiconductor chip. A general goal for such memories is that they be low price, fast, and not consume too much power. As memories on a single semiconductor chip become larger, it becomes desirable to arrange the memory into blocks. As an example, a 64K Random Access Memory (RAM) may be arranged in a two block configuration. In such a configuration it is preferred to have a single data in buffer for the memory chip which provides data to two different write circuits, one for each block. A portion of the address signal can be used to select which of the write circuits must be selected for the side of the memory array that is to be written into. Since the data in buffer is common to both write circuits it becomes very important that the non-selected write circuit is effectively non-selected to prevent a momentary glitch or noise from causing data to be modified in the non-selected side of the memory array. This problem is further aggravated in high density RAMs where signal margins are traded off to achieve smaller chip size.

In a typical memory system having one data in buffer and two write circuits, it is customary to have transfer devices between the data in buffer and the write circuits. In the past, in many such configured memories the transfer devices would be enabled first, when preparing for a write function, and then the address signal would be used to disable the non-selected write circuit. This approach has disadvantages in that data modification can occur to the non-selected side. The data modification results because the voltage to the non-selected transfer device must be discharged to a good "zero" level before a data in signal occurs. If a race condition exists between the discharge of the transfer device and the arrival of the data in signal the non-selected write circuit could be momentarily activated. This problem is further aggravated by process variations on thresholds. A preferred arrangement would be to have the transfer devices in a non-selected state and then to only activate the selected transfer device.

Accordingly, it is an object of the present invention to provide an improved write circuit for a read/write memory which is in a non-selected state until it is selected.

Another object of the present invention is to provide a write circuit for a memory which, when enabled, will accept data from a data in buffer without causing a delay due to settling time of the write circuit itself.

SUMMARY OF THE INVENTION

In carrying out the above and other objects of the invention in one form, there is provided a read/write circuit having transferring means for controllably transferring data from a data in buffer into the write circuit. An isolation means is coupled to the transferring means to isolate the transferring means from an incoming address signal and at the same time to control the transferring means. Field effect transistors are also used on the output of the transferring means to keep the output of the transferring means in a discharged state when the write circuit is not being used. The output of the transferring means is coupled to a latch which provides the output for the write circuit.

The subject matter which is regarded as the invention as set forth in the appended claims. The invention itself, however, together with further objects and advantages thereof, may be better understood by referring to the following detailed description taken in conjunction with the accompanying drawings.

DETAILED DESCRIPTION OF THE DRAWINGS

Figure 1:
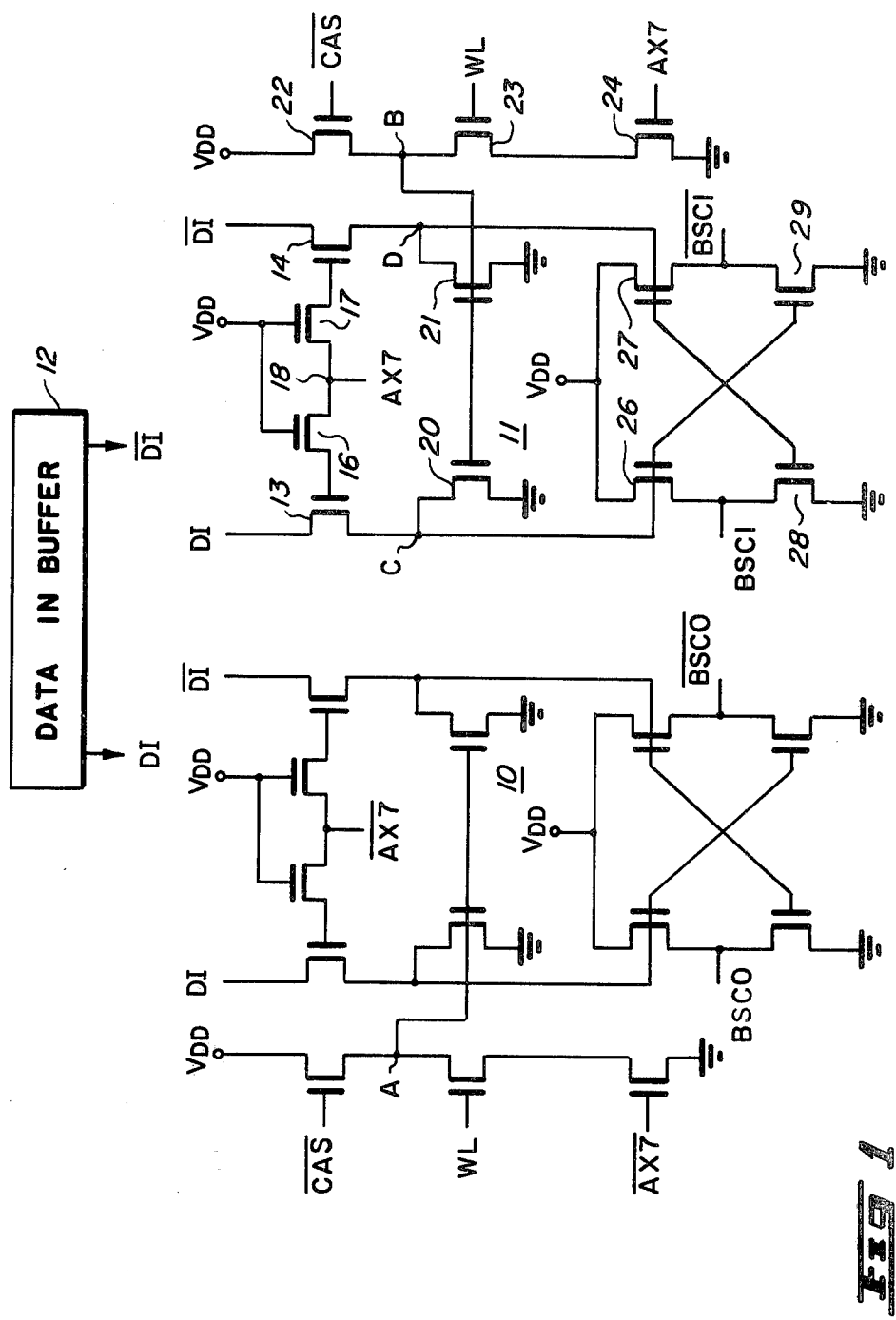
FIG. 1 illustrates in schematic form an embodiment of the invention.

In an integrated semiconductor memory, input to the memory is generally received by a data in buffer. The output of the data in buffer is then coupled to a write circuit which provides the data onto bit sense common lines in the memory. The bit sense common lines are then coupled to bit sense lines within the memory array itself. It may be desirable to separate a large memory array into blocks thereby requiring more than one write circuit to be coupled to the data in buffer. In FIG. 1, data in buffer 12 is illustrated as providing outputs DI and $\overline{DI}$ to two write circuits 10 and 11. DI and $\overline{DI}$ are complements of each other, and circuits 10 and 11 are identical to each other. The operation of circuit 11 will be explained in detail hereinafter and it will be understood that circuit 10 contains the same elements and operates in the same manner with the exception that it receives an address signal $\overline{AX7}$ and provides outputs BSC0 and $\overline{BSC0}$ while circuit 11 receives address signal AX7 and provides outputs BSC1 and $\overline{BSC1}$.

Transistors 13 and 14 couple or transfer DI and $\overline{DI}$, respectively, into write circuit 11. Two transistors 16 and 17 are connected in series between gate electrodes of transistors 13 and 14. Transistors 16 and 17 both have their gate electrodes coupled to voltage terminal VDD. A node 18 is formed between transistors 16 and 17 and receives an address signal AX7. When address signal AX7 is a logic level high, circuit 11 is enabled, and since $\overline{AX7}$ is a complement of AX7, circuit 10 is not enabled. Circuit 10 is enabled when $\overline{AX7}$ is high and then circuit 11 remains in an inactive state. Transistors 16 and 17 serve as isolation means to isolate AX7 and the capacitance associated with the line carrying AX7 up to circuit 11 from transistors 13 and 14 respectively. If it is assumed that AX7 is high, the voltage appearing on the gate electrode of transistor 13 will be $V_{DD}$ minus the threshold voltage ($V_T$) of transistor 16. As data input signal DI goes high it gets coupled to the gate electrode of transistor 13 by the inherent capacitance of the transistor itself. This capacitive coupling effect serves to boost the voltage level on the gate electrode of transistor 13. This insures that the voltage at node C is the full voltage level of DI and to insure that the outputs to the bit sense common lines are as close to the full voltage of DI minus $V_T$ as possible. The voltage on the BSC1 line will be the voltage at node C minus the threshold voltage ($V_T$) of transistor 26. If the voltage on node C gets too low then the data reaching the memory cell will be a degraded logic "one" level.

Transistor 20 is coupled between node C and a voltage reference potential illustrated as ground. Transistor 21 is coupled between node D and ground. Node D serves as the output for transferring means or transistor 14 and node C serves as the output for transferring means or transistor 13. Transistor 20 and 21 have their gate electrodes coupled to node B. Transistors 20 and 21 serve as a discharge means to discharge the output of transfer transistors 13 and 14, or in other words they serve to shunt nodes C and D to ground. Series connected transistors 22, 23, and 24 serve as control means to control transistors 20 and 21. Node B is formed by the junction between transistors 22 and 23. Transistor 22 has its drain coupled to voltage terminal $V_{DD}$ while transistor 24 has its source coupled to ground. A column address strobe complement signal $\overline{CAS}$ is coupled to the gate electrode of transistor 22. A write latch signal WL is coupled to the gate electrode of transistor 23 and address signal AX7 is coupled to the gate electrode of transistor 24. When write latch signal WL is a logic high and circuit 11 is addressed by address AX7, transistors 23 and 24 will be enabled thereby placing node B at near ground potential. In this condition node B cannot enable transistors 20 and 21 and therefore node C and D will be allowed to float.

Transistors 26 and 28 are connected in series between voltage $V_{DD}$ and ground and provide an output BSC1 from a node formed in between them. Transistors 27 and 29 are connected in series between voltage terminal $V_{DD}$ and ground and provide an output $\overline{BSC1}$ from a node formed at their midpoint. Transistors 26 and 29 have their gate electrodes coupled to node C while transistors 27 and 28 have their gate electrodes coupled to node D. When node C is high, transistor 26 will be enabled thereby coupling voltage level DI minus $V_T$ to BSC1 line. Transistor 29 is also enabled by node C being high thereby placing line $\overline{BSC1}$ at ground. Transistors 26, 27, 28 and 29 serve as a latch which couple the signal at node C or D to the memory array by way of lines BSC1 and $\overline{BSC1}$.

Figure 2:
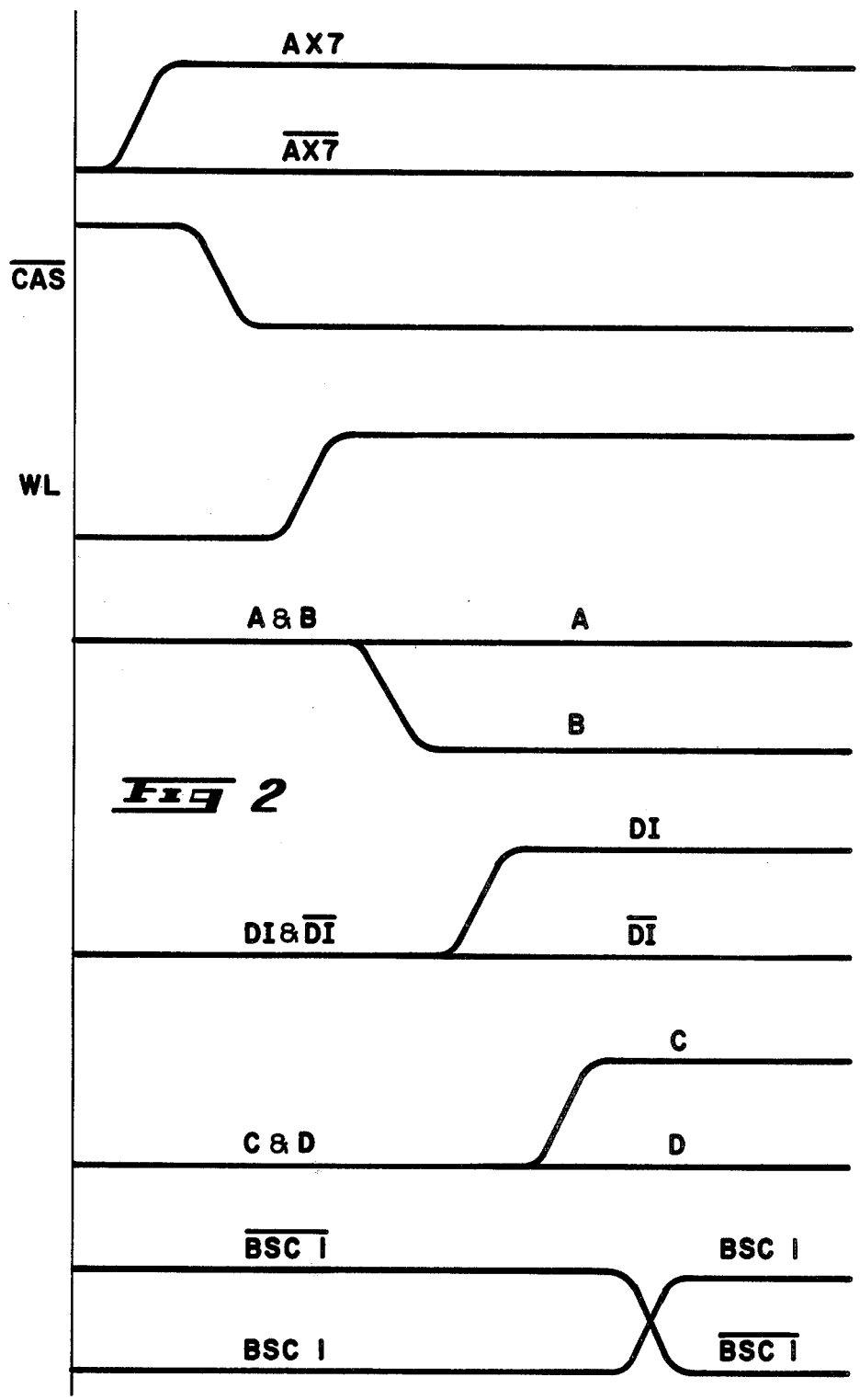
FIG. 2, including a–d, is a timing chart useful in understanding the operation of the circuit of FIG. 1.

FIG. 2 shows some timing waveforms helpful for better understanding the operation of the circuitry of FIG. 1. Address signals AX7 and $\overline{AX7}$ are illustrated in the top waveform. Complementary column address strobe $\overline{CAS}$ is illustrated in the second waveform and write latch WL is illustrated in the third waveform. The top three waveforms illustrate the input control signals for write circuit 10 and 11. As shown, address signal AX7 goes high and address signal $\overline{AX7}$ stays low. As the column address strobe signal is acitivated $\overline{CAS}$ goes low and then write latch signal WL goes high. With AX7 high and WL high, node B goes low. Node A which is a corresponding node in circuit 10 remains at a high level. In the timing chart of FIG. 2 it is assumed that data input signal DI goes high. When signal DI goes high it serves to further increase the amplitude of the signal at the gate of transistor 13 due to the capacitive coupling effect of the inherent capacitance of transistor 13 as explained hereinbefore. The output of transistor 13 is coupled to node C. Node D remains at the low level since data input signal $\overline{DI}$ remains low. There is a slight delay in time from when data signal DI goes high and the signal at node C goes high to illustrate the actual condition in circuit 11 where transistor 13 delays the transfer of the signal slightly through its normal transistor action. By node C going high transistors 26 and 29 are enabled which cause output signal BSC1 to go high and drives $\overline{BSC1}$ low. $\overline{BSC1}$ was high to begin with from a previous read function.

By now it should be appreciated that there has been provided a write circuit which is held in a discharged or non-selected condition until it is desirable to write data into the memory. In the example illustrated two write circuits are used with one data in buffer. With the circuit provided, the data does not have to be delayed in the buffer waiting for the write circuits to discharge, therefore faster write time can be achieved.

We claim:

1. A write circuit for a read/write memory, comprising: transferring means for controllably transferring data from a data in buffer into the write circuit; isolation means coupled to the transferring means to isolate an address signal from the transferring means, the isolation means also being capable of controlling the transferring means; precharging means for controllably discharging the output of the transferring means; control means coupled to the precharging means for controlling the precharging means; and latching means coupled to the output of the transferring means for coupling the output of the transferring means into the memory.

2. The write circuit of claim 1 wherein the control means includes field effect transistors connected in series with each having a gate electrode for receiving a control signal.

3. The write circuit of claim 1 wherein the isolation means includes at least one field effect transistor having a first, a second, and a gate electrode, the gate electrode being coupled to a voltage potential, the first electrode being coupled to a select signal and the second electrode being coupled to the transferring means.

4. The write circuit of claim 1 wherein the transferring means comprises a field effect transistor having a first and a second current carrying electrode and a gate electrode, the gate electrode being coupled to the isolation means so that the isolation means can control the transferring means, the first current carrying electrode being coupled to the data in buffer, and the second current carrying electrode being for providing the output.

5. A circuit for controllably coupling data from an input buffer into a system, the circuit having a first and a second voltage terminal, comprising: a first and a second transistor for coupling data and its complement from the input buffer into the circuit; a third and a fourth transistor coupled in series between gate electrodes of the first and second transistors, the third and fourth transistors having gate electrodes coupled to the first voltage terminal and a first select signal coupled to a junction formed in between the third and fourth transistors; a fifth transistor having a gate electrode and being coupled between the first transistor and the second voltage terminal; a sixth transistor having a gate electrode and being coupled between the second transistor and the second voltage terminal; a seventh and an eighth transistor coupled in series between the first and second voltage terminal, and each transistor having a gate electrode; a ninth and a tenth transistor coupled in series between the first and second voltage terminals and each transistor having a gate electrode, the gate electrode of the seventh and tenth transistors being coupled to the first transistor and the gate electrodes of the ninth and eighth transistors being coupled to the second transistor; and a control signal coupled to the gate electrodes of the fifth and sixth transistors.

6. The circuit of claim 5 wherein the seventh and eighth transistors form a node therebetween which provides a first output for the circuit, and the ninth and tenth transistors forming a node therebetween which provides a second output for the circuit, the first and second outputs being complements of each other.

7. The circuit of claim 5 further including transistors coupled in series between the first and second voltage terminal, and each transistor having a gate to receive a select signal so that the transistors coupled in series can provide the control signal to control the fifth and sixth transistors.

8. The circuit of claim 5 wherein a first and a second such circuits are used for coupling data into a binary memory system and the first select signal is used to enable the first such circuit for coupling data into the memory and a complement of the first select signal is used to enable the second such circuit.

* * * * *